(12) United States Patent
Asano et al.

(10) Patent No.: US 6,911,847 B2
(45) Date of Patent: Jun. 28, 2005

(54) CURRENT SWITCHING TYPE OF HIGH-SPEED LOGIC CIRCUIT WHICH GENERATES OUTPUT PAIR OF DIFFERENTIAL SIGNALS EACH HAVING ACCURATELY MATCHED RISE-TIME AND FALL-TIME WAVEFORM CHARACTERISTICS

(75) Inventors: Hiroaki Asano, Yokohama Kanagawa (JP); Mitsuru Saito, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 885 days.

(21) Appl. No.: 09/900,167

(22) Filed: Jul. 9, 2001

(65) Prior Publication Data

US 2002/0003439 A1 Jan. 10, 2002

(30) Foreign Application Priority Data

Jul. 7, 2000 (JP) .................................... 2000-207176

(51) Int. Cl.[7] .................. H03K 19/094; H03K 19/20
(52) U.S. Cl. .................. 326/115; 326/118; 326/126
(58) Field of Search .................. 326/115–118, 119, 326/121, 126, 127–130

(56) References Cited

U.S. PATENT DOCUMENTS 5,177,378 A * 1/1993 Nagasawa .................. 326/115
5,777,505 A * 7/1998 LaRue .................. 327/407

* cited by examiner

Primary Examiner—Don Le
(74) Attorney, Agent, or Firm—Connolly Boye Lodge & Hutz LLP

(57) ABSTRACT

A two-input logic gate circuit suitable for extremely high-speed operation, which operates on two differential signal pairs expressing respective logic inputs, includes a control signal generating circuit which converts the input differential signal pairs to two sets of differential control signal pairs respectively having first and second level ranges, to be supplied to a current switching section. The current switching section includes first and second switching stages each formed of two source-coupled FET pairs, with differential control signal pairs of the first and second level ranges being applied to FET pairs of the first and second switching stages respectively, with the current switching section thereby selectively establishing current paths to generate a differential signal pair at two load resistors such that each signal of that differential pair results from switching of currents flowing in an identical number of paths, and with each path passing via an identical number of FETs into respective current sources, thereby enabling an output differential signal pair to be obtained in which each signal has identical rise-time and fall-time characteristics.

33 Claims, 8 Drawing Sheets

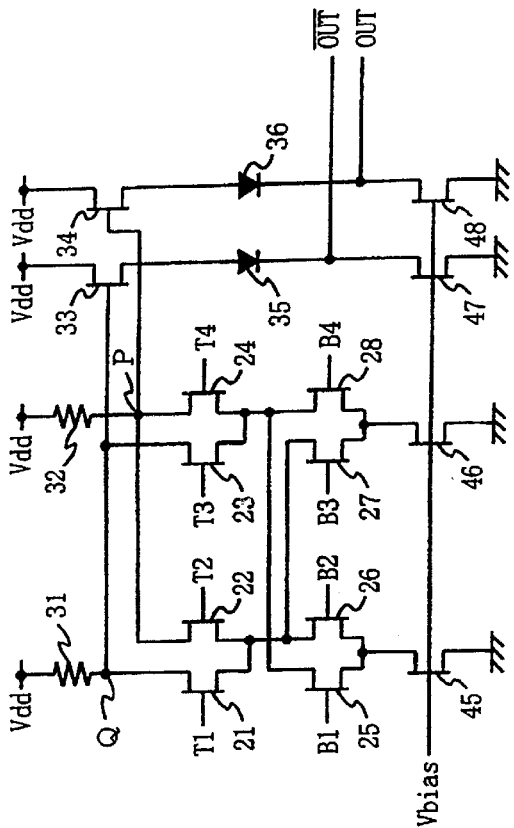
FIG. 3A
FIG. 3B
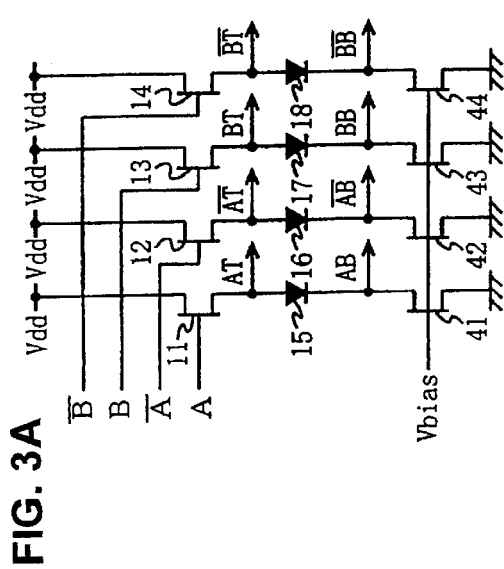
FIG. 3C

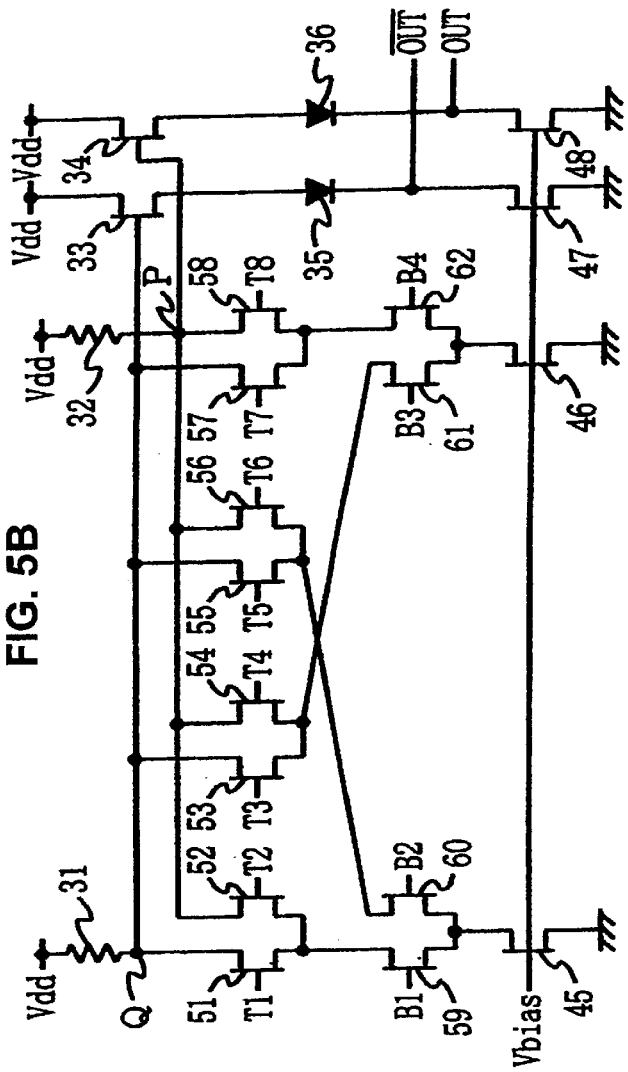

FIG. 5A
FIG. 5B

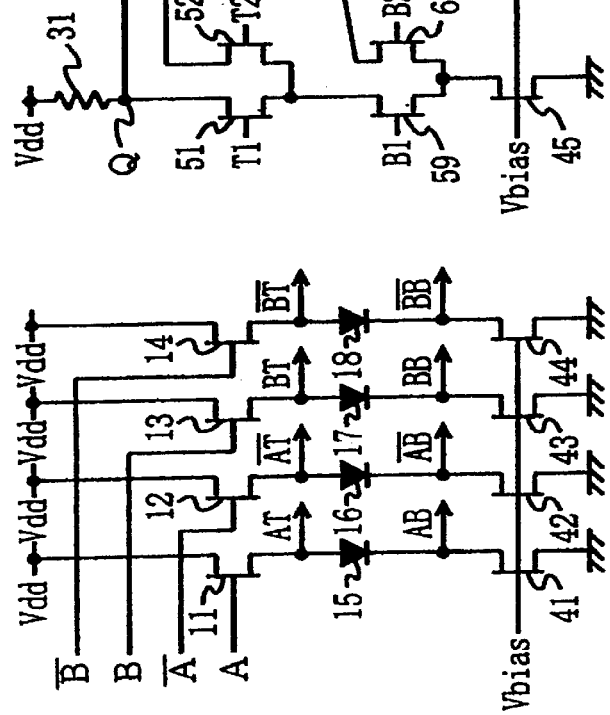

FIG. 5C

| | CONNECTION RELATIONSHIPS | | | | | | | | | | | | OUTPUT SIGS. | |
|---|---|---|---|---|---|---|---|---|---|---|---|---|---|---|
| LOGIC OP. | T1 | T2 | T3 | T4 | T5 | T6 | T7 | T8 | B1 | B2 | B3 | B4 | $\overline{OUT}$ | OUT |
| EXOR | AT | $\overline{AT}$ | BT | $\overline{BT}$ | $\overline{AT}$ | AT | $\overline{BT}$ | BT | $\overline{BB}$ | BB | $\overline{AB}$ | AB | $\overline{A}.B + A.\overline{B}$ | $A.B + \overline{A}.\overline{B}$ |
| EXNOR | AT | $\overline{AT}$ | BT | $\overline{BT}$ | $\overline{AT}$ | AT | $\overline{BT}$ | BT | BB | $\overline{BB}$ | AB | $\overline{AB}$ | $A.B + \overline{A}.\overline{B}$ | $\overline{A}.B + A.\overline{B}$ |

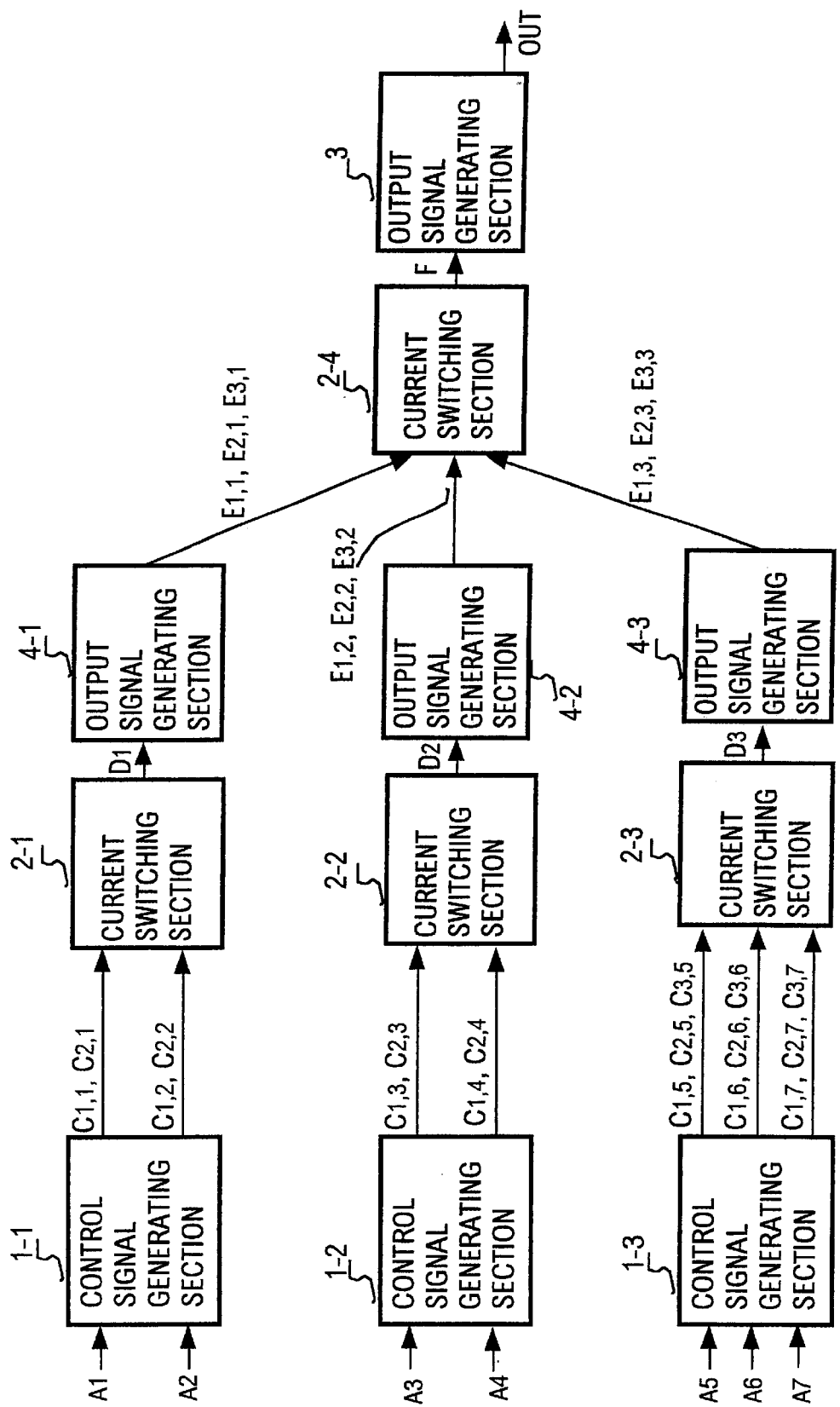

CURRENT SWITCHING TYPE OF HIGH-SPEED LOGIC CIRCUIT WHICH GENERATES OUTPUT PAIR OF DIFFERENTIAL SIGNALS EACH HAVING ACCURATELY MATCHED RISE-TIME AND FALL-TIME WAVEFORM CHARACTERISTICS

BACKGROUND OF THE INVENTION

1. Field of the Invention

The present invention relates to a transistor logic circuit for performing logic operations on a plurality of logic inputs expressed by respective pairs of input differential signals.

2. Description of Prior Art

At present, high-speed transistor logic circuits operating at speeds of the order of several tens of GHz, which are based on elements formed of materials such as gallium arsenide, are becoming used in fields of application such as data communication in which high-speed logic processing is necessary. With one type of such high-speed logic circuit, a plurality of differential transistor pairs (where the term "differential transistor pair" is used herein, unless otherwise indicated, to refer to a pair of field-effect transistors having the source electrodes thereof connected together, with the term field-effect transistor being abbreviated to "FET") are connected such as to selectively enable a plurality of current paths, in accordance with respective differential signal pairs applied to the gate electrodes of the transistor pairs, to perform a logic operation.

The term "differential signal pair" is used herein to signify a pair of binary signals, one of which is the logic inverse of the other, i.e., which vary in mutually opposite directions between logic high and low potentials (referred to herein as the H and L levels respectively, of that signal pair). The voltage range of such H, L level variation, for any specific differential signal pair, in relation to a circuit reference (ground) potential, will be referred to as the level range of that signal pair. One signal of such a pair will be designated as the non-inverted signal (for example whose H and L levels are considered as the logic "1" and "0" states respectively) and the other as the inverted signal, with each such inverted signal being indicated by a superimposed bar on the signal name, in the appended drawings, and by the suffix "-bar" in the following description.

FIG. 8 shows a prior art example of an AND gate which utilizes a source-coupled logic circuit. This is formed of a current switching section which performs logic operations by switching of current paths, and an output signal generating section which produces an output differential signal pair in response to the switching operations of the current switching section. The AND gate operates on two input differential signal pairs, respectively designated as A, A-bar and B, B-bar (with the level range of the pair B, B-bar being lower than that of the pair A, A-bar) to obtain the output differential signal pair OUT, OUT-bar which express the logic product of the logic inputs expressed by signals A and B. The current switching section is formed of FETs 71 to 74, load resistors 31, 32, and a FET 49 which functions as a current source. The source electrodes of the FETs 71, 72 are connected together, as are the source electrodes of the FETs 73, 74, to form two differential transistor pairs. As shown in FIG. 8, the differential transistor pairs are connected in a multi-stage configuration, with current paths passing through the load resistors 31, 32 respectively and through the multi-stage arrangement of differential transistor pairs, into the current source formed by FET 49, and with the transistor pair 71,72 controlled by the differential signal pair A, A-bar and the transistor pair 73, 74 controlled by the differential signal pair B, B-bar.

The output signal generating section is formed of FETs 33, 34, diodes 35, 36, and FETs 47, 48 which function as respective current sources. The FETs 34, 48 and diode 36 constitute a first source follower circuit, which provides current amplification of the signal appearing at point Q, to produce a final output signal OUT having increased drive capacity, with the corresponding inverse signal OUT-bar being produced by a second source follower circuit formed of the FETs 33, 47 and diode 35. The output differential signal pair OUT, OUT-bar vary in potential in the same directions as for the points P, Q respectively, which will be referred to as the connection points. The output differential signal pair OUT, OUT-bar thus express the logic product of the input signals A and B.

A basic problem of such a prior art logic circuit will be described referring to the timing diagram of FIGS. 9A and 9B. FIG. 9A shows the signal waveforms for the case in which the input differential signal pair A, A-bar undergo logic level transitions between the H and L potentials at identical time points, as also do the input signal pair B, B-bar. FIG. 9B is an expanded view of part of FIG. 9A.

With the circuit of FIG. 8, the following current switching operations are performed on the currents which flow through the differential transistor pairs, in accordance with the voltage levels of the input differential signal pairs, A, A-bar and B, B-bar. When both of the signals A and B are at the H level, then current flows in a first current path via the load resistor 31 and FETs 71, 73. In that condition, designating the Vdd potential of the power source as VH as indicated in FIG. 9B, the voltage at the connection point Q will go to a lower value, designated as VL1, as determined by the load resistor value and the level of current in the first current path. In that condition, if the input signal A goes to the L level with input signal B remaining at the H level, then current flows in a second current path via the load resistor 32 and FETs 72, 73. When this occurs, the respective drain-source voltages across each of the FETs 72, 73, 49 will be identical to the drain-source voltages across the FETs 71, 73, 49 when current flows in the first current path, i.e., there is no change in the potential of the point R, the same level of current flows in that path, and so the potential at the connection point P will fall to VL1.

If the input signal B goes to the L level, then irrespective of the level of the input signal A, current flows in a third current path via the load resistor 32 and FETs 74, 49. In this case, current flows through one less FET than for the case of the first or second current path. As a result, a greater value of drain-source bias voltage is developed across each of the FETs 74 and 49, which causes the current passed by the current source FET 49 to increase, by comparison with the level of current of the first or second current paths. The voltage at the connection point P therefore falls to a value VL2, which is lower than VL1, as shown in FIG. 9B.

As a result, even if the pair of input differential signals that are applied to control the differential transistor pair 73, 74 should change in opposite directions at exactly the same time points, there will be a deviation between the respective time points at which current switching occurs for the load resistor 31 and for the load resistor 32. Hence, when a logic level transition of the input signal A occurs, the output signal pair OUT, OUT-bar will not change over between high and low logic level potentials at identical time points.

Specifically, as illustrated in FIG. 9B, there will be an offset voltage amount ΔV between the crossover point of transitions of the output signals OUT, OUT-bar when OUT goes from the L to H level (i.e., from VL1 to VH in FIG. 9B) and the crossover point of these signal transitions when OUT goes from the H to the L level (i.e., from VH to VL2 in FIG. 9B). Since the AND gate is required to operate at a frequency which may be several tens of GHz, such a difference between the waveform rise-time and fall-time characteristics of each signal of the output differential signal pair is a serious problem.

SUMMARY OF THE INVENTION

It is an objective of the present invention to overcome the problems of the prior art set out above, by providing a transistor logic circuit whereby each signal of an output differential output signal pair produced by the logic circuit will have waveform rise-time and fall-time characteristics that are substantially identical.

This is achieved by configuring such a logic circuit as a combination of a novel type of current switching section in conjunction with a control signal generating section and output signal generating section. The control signal generating section receives a set of input differential signal pairs, with the signal pairs expressing respective ones of a plurality of logic inputs, and converts that set into a plurality of differential control signal pairs with these sets having respective level ranges (i.e., ranges of transition between high and low logic level potentials) that are appropriate for being supplied to the current switching section. A differential signal pair is thereby generated by the current switching section, expressing the result of a logic operation on the logic inputs, and is supplied to an output signal generating circuit to obtain an output differential signal pair that is suitable for driving succeeding logic circuits.

Specifically, with n logic inputs (where n is a plural integer) there are n input differential signal pairs supplied to the logic circuit, with each of these signal pairs being converted to n corresponding differential control signal pairs having respectively different ones of n predetermined level ranges so that a total of $n^2$ control signal pairs are generated, and supplied to the current switching section. The current switching section includes a multi-stage connection network formed of interconnected pairs of transistors, wherein (assuming that FETs are utilized) each pair has the source electrodes connected together, with the gate electrodes of each transistor pair controlled by one of the differential control signal pairs. These transistor pairs are interconnected as n sets, referred to herein as switching stages, each formed of a plurality of transistor pairs. The current switching section further includes a pair of load resistors each coupled to one potential of a DC power source and n current sources (e.g., respective FETs functioning as current sources) coupled to the other potential of the power source, with the switching stages being connected in series between these load resistors and the current sources such as to selectively control the establishment of current paths from the load resistors to the current sources, in accordance with the differential control signals.

Basic features of such a current switching section are that:

(a) the transistor pairs of each switching stage are driven by differential control signal pairs which each have the same level range, with successively differing level ranges being utilized for successive switching stages;

(b) (assuming the case of FETs) the drain electrodes of one transistor in each transistor pair of the first switching stage are connected in common to one of the load resistors, while the drain electrodes of the remaining transistors of these transistor pairs are connected in common to the second load resistor, (c) the mutually coupled source electrodes of each transistor pair in a switching stage are coupled to drain electrodes of one transistor in each of one or more predetermined transistor pairs in the succeeding stage, other than for a final switching stage, in which these mutually connected pairs of source electrodes are connected to respective ones of the current sources, (d) for each of the possible combinations of logic inputs to the logic circuit, the resultant combination of control signals control the current switching section such that a set of one or more current paths are established between only one of the load resistors and the current sources, with the number of current paths in each set being identical for each of these combinations of logic inputs, and (e) the interconnections between successive switching stages are configured such that each of these current paths passes through one FET in each of the switching layers.

Hence, the respective drain-source voltages that are developed across each of the FETs within each of the possible current paths will be the same for all of these paths. Thus, when devices such as FETs are utilized as respective current sources, the current level that is determined by each current source can be held at a fixed level irrespective of the path taken by the current, since the drain-source bias voltage of each current source FET will not change in accordance with different current paths.

In that way it is ensured that a differential signal which is produced by the current switching section at the pair of points of connection between the multi-stage connection network and the two load resistors will not exhibit the problem of the prior art described above referring to FIGS. 8, 9A and 9B. That is to say, each of the pair of differential signals produced by the current switching section will have substantially identical rise-time and fall-time waveform characteristics, and hence the corresponding output signal pair produced from the output signal generating circuit will also have identical rise-time and fall-time waveform characteristics.

In the case of one configuration of the invention, which is applicable to various logic functions such as an n-input AND gate, NAND gate, OR gate or NOR gate, the current switching section has the further basic features:

(a) there are n switching stages, with each switching stage formed of n transistor pairs, and (b) the mutually connected source electrodes of each transistor pair of each switching stage other than the n-th switching stage are connected to respective drain electrodes of one transistor in each of two corresponding transistor pairs of the succeeding switching stage.

Designating i and j as integers that have values i≦1 through (n−1) and 1 through n respectively, designating as $X_{i,j}$ a differential transistor pair in the current switching section that are controlled by a differential control signal pair which are at the i-th level range and which correspond to the j-th differential input signal pair, designating the transistor of the pair $X_{i,j}$ that is set in the on (i.e., conducting between drain and source) state when the non-inverted one of the j-th input signal pair is at the H (logic high) level as $S_{i,j}$ and designating the transistor of the pair $X_{i,j}$ that is set in the on state when the inverted one of the j-th input signal pair is at the H level as $T_{i,j}$, the configuration of the latter current switching section can be expressed as follows, again assuming the case of FETs being utilized: the mutually connected source electrodes of the transistor pair $X_{i,j}$ are connected to the drain electrode of one transistor of the transistor pair $X_{i+1,j}$ and to the drain electrode of one transistor of the transistor pair $X_{i+1,j+1}$, when j is other than n, and are connected to the drain electrode of one transistor of the transistor pair $X_{i+1,j}$ and to the drain electrode of one transistor of the transistor pair $X_{i+1,l}$ when j is equal to n.

The mutually connected source electrodes of the transistor pairs $X_{i,j}$ for which i is equal to n (i.e., the transistor pairs of the n-th switching stage) are connected via respective current sources to the second potential of the power source. These current sources will typically be formed of respective FETs having a common gate-source bias voltage applied to each, so that each will provide substantially the same level of set current when the same value of drain-source bias voltage is applied thereto.

In particular, in the case of a 2-input logic circuit which is configured in this way, i.e., when n equals 2, so that the current switching section has two switching stages each having two transistor pairs, the logic circuit can be readily adapted to performing each of a variety of different logic functions including the AND, OR, NAND, NOR functions, simply by altering the combinations of connections between the differential control signal pairs and the gate electrodes of the four differential transistor pairs in the current switching section. Alternatively, a logic circuit according to the present invention can be configured as a 2-input logic gate that can be adapted to perform logic functions including at least the exclusive-OR and the exclusive-NOR. In that case, the current switching section is formed of two switching stages, which are driven by differential control signals of two different level ranges, with the first stage formed of four differential transistor pairs and the second switching stage formed of two differential transistor pairs. Designating the two differential input signal pairs expressing the logic inputs to the logic circuit as the first and second differential input signal pairs respectively, and designating the switching stage having transistors that are coupled to the two load resistors as the first switching stage and the switching stage having transistors that are coupled to the current sources as the second switching stage, the interconnection arrangement of the current switching section can be expressed as follows:

first and second transistor pairs, in the first switching stage, are each controlled by a differential control signal pair having the first level range, corresponding to the first differential input signal pair, third and fourth transistor pairs, in the first switching stage, are each controlled by a differential control signal pair having the first level range, corresponding to the second differential input signal pair, a fifth transistor pair, in the second switching stage, are controlled by a differential control signal pair having the second level range, corresponding to the first differential input signal pair, and a sixth transistor pair, in the second switching stage, are controlled by a differential control signal pair having the second level range, corresponding to the second differential input signal pair.

Also, with such a current switching section, (again assuming the use of FETs) the drain electrode of a first transistor of each of the transistor pairs in the first switching stage is connected at one of a pair of connection points to a first terminal of a first load resistor while the drain electrode of a second transistor of each of the transistor pairs in the first switching stage is connected at the other connection point to a first terminal of a second load resistor, with the other terminals of the load resistors being connected to the first potential of the DC power source, while the mutually connected source electrodes of each transistor pair of the second switching stage are connected via respective current sources to the second potential of the power source.

In particular, such an interconnection configuration is preferably implemented such that:

the mutually connected first terminals of the first transistor pair are connected to a third terminal of a first transistor of the sixth transistor pair, the mutually connected first terminals of the second transistor pair are connected to a third terminal of a second transistor of the sixth transistor pair, the mutually connected first terminals of the third transistor pair are connected to a third terminal of a first transistor of the fifth transistor pair, and the mutually connected first terminals of the fourth transistor pair are connected to a third terminal of a second transistor of the fifth transistor pair.

It is another aspect of the invention that a plurality of such logic circuits can be connected to form a compound logic gate, formed of a succession of logic stages to perform an operation that is a combination of a plurality of logic operations. Such a compound logic gate is formed of one or more control signal generating sections, a plurality of current switching sections, one or more inter-stage output signal generating sections disposed between successive current switching sections, and an output signal generating section as described above.

BRIEF DESCRIPTION OF THE DRAWINGS

FIGS. 3A and 3B are circuit diagrams illustrating the overall configuration of the first embodiment, and FIG. 3C is a table showing respective combinations of signal interconnections whereby various different logic operations can be performed by the first embodiment;

FIGS. 5A and 5B are circuit diagrams of a third embodiment of a logic circuit, and FIG. 5C is a table showing respective combinations of signal interconnections whereby the third embodiment can be configured either as a 2-input EXOR gate or EXNOR gate;

FIG. 6 is a circuit block diagram of a fourth embodiment of a logic circuit, constituting a compound AND-OR gate;

DESCRIPTION OF PREFERRED EMBODIMENTS

First Embodiment

Figure 1:
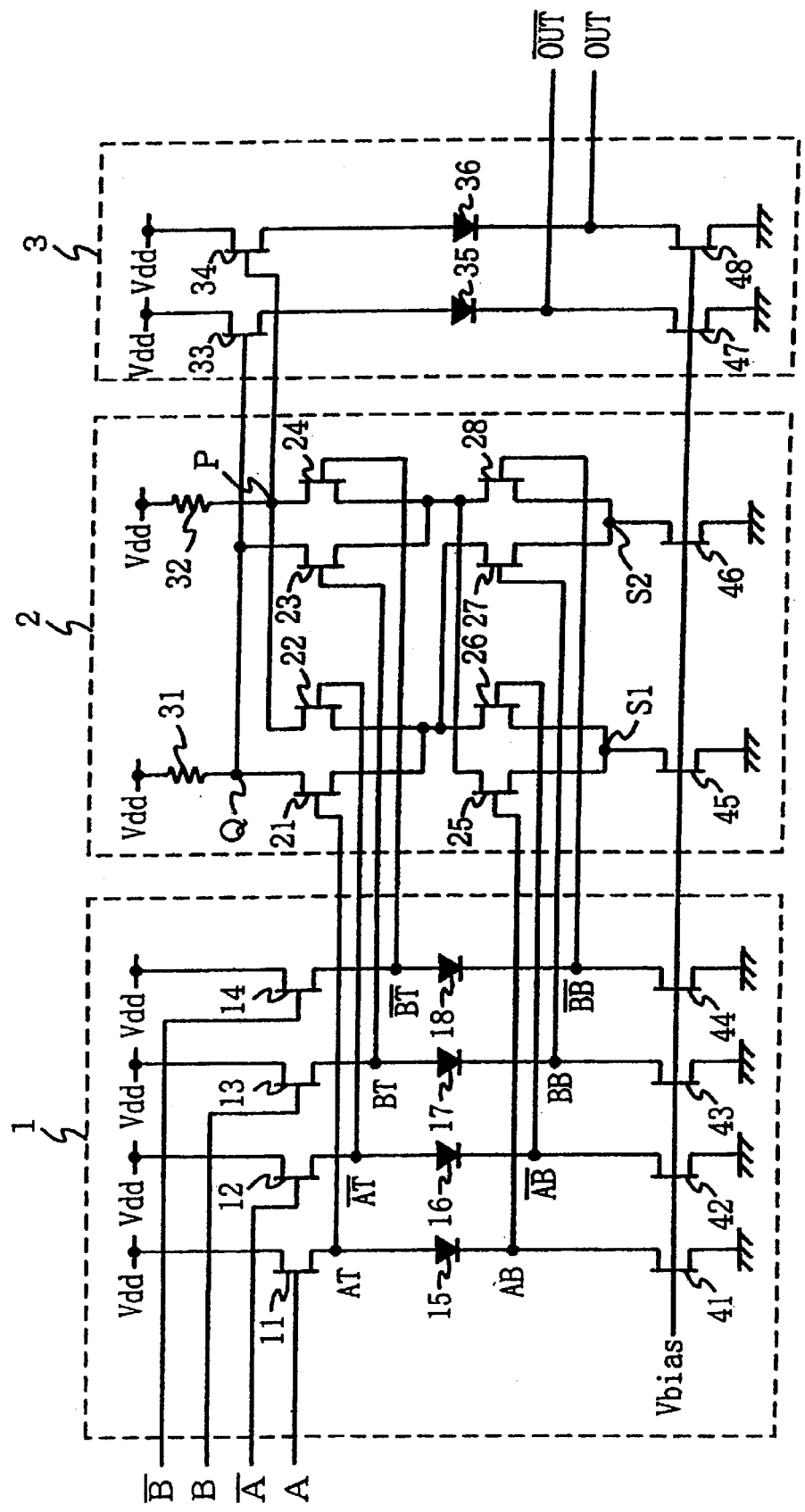
FIG. 1 is a circuit diagram of a two-input AND gate configured in accordance with a first embodiment of a logic circuit.

FIG. 1 is a circuit diagram showing the configuration of a two-input AND gate in accordance with a first embodiment of a transistor logic circuit according to the present invention. This AND gate operates on two pairs of input differential signals A, A-bar and B, B-bar to obtain the logic product of the signals A, B, expressed as a pair of output differential signals designated as OUT, OUT-bar. The AND gate of FIG. 1 is formed of a control signal generating section 1, a current switching section 2 and an output signal generating section 3. the control signal generating section 1 is formed of FETs 11 to 14, diodes 15 to 18, and FETs 41 to 44 which function as respective current sources. The current switching section 2 is formed of FETs 21 to 28, load resistors 31 and 32, and FETs 45, 46 which function as respective current sources. The output signal generating section 3 is formed of FETs 33, 34, diodes 35 and 36, and FETs 47 and 48 which function as respective current sources, with the current source FETs 41 to 48 each having the same value of gate bias voltage applied, and serving to determine respective levels of current flow in current paths within the various circuit sections.

In the control signal generating section 1, each of the input signals A, A-bar, B, B-bar is operated on to produce both corresponding source follower control signals (i.e., designated AT, AT-bar, BT, BT-bar respectively) and also a corresponding set of level-shifted control signals (designated AB, AB-bar, BB, BB-bar). For example, the drain, gate and source electrodes of the FET 11 are respectively connected to the power source potential Vdd, the input signal A, and the anode of the diode 15, while the cathode of the diode 15 is connected to the current source constituted by FET 41. The signal AT is thereby obtained in response to the input signal A as a source-follower control signal from the source electrode of FET 11, while the corresponding level-shifted signal AB (having a level range that is shifted towards ground potential, relative to the level range of signal AT) is obtained as a result of the voltage drop which occurs across the diode 15. The source follower control signals AT-bar, BT, BT-bar and level-shifted signals AB-bar, BB, BB-bar are similarly obtained in response to the input signals A-bar, B and B-bar, with the signal pair BB, BB-bar having the same level range as the pair AB, AB-bar.

The four pairs of differential control signals (AT, AT-bar), (BT, BT-bar), (AB, AB-bar) and (BB, BB-bar) that are thereby obtained from the control signal generating section 1 are supplied to the current switching section 2, which performs logic processing by means of switching of currents through respective current paths in accordance with the states of the differential control signals. The eight FETs 21 to 28 of the current switching section 2 are connected as four differential transistor pairs, i.e., with the source electrodes of each pair connected together.

As shown in FIG. 1, the four differential transistor pairs are connected as two stages (referred to in the following as respective switching stages), successively interconnected between the load resistors 31, 32 and the current source FETs 45, 46, with an upper switching stage containing the differential transistor pairs 21,22 and 23, 24 and a lower switching stage containing the differential transistor pairs 25, 26 and 27, 28. In the upper switching stage the drain electrodes of the FETs 21 and 23 are each connected at a connection point indicated as Q to one terminal of the load resistor 31, whose other terminal is connected to the power source potential Vdd, while the drain electrodes of the FETs 22 and 24 are each connected at a connection point indicated as P to one terminal of the load resistor 32, whose other terminal is connected to the power source potential Vdd. The source electrodes of the FETs 21, 22 are connected in common to the drain electrodes of each of the FETs 26, 27 of the lower switching stage. The source electrodes of the FETs 23, 24 are connected in common to the drain electrodes of each of the FETs 25, 28. The current source FET 45 is connected between the low potential of the power source, which is the circuit ground potential, and the common connection of the source electrodes of the FETs 25, 26. The current source FET 46 is similarly connected between ground potential and the common connection of the source electrodes of the FETs 27, 28.

The four differential transistor pairs are supplied with respective ones of the four differential control signal pairs produced from the control signal generating section 1. Specifically, Of these four differential transistor pairs, the gate electrodes of the pairs 21, 22 and 23, 24 in the upper switching stage are coupled to respectively receive the differential control signal pairs AT, AT-bar and BT, BT-bar having the higher level range. The gate electrodes of other two differential transistor pairs 25, 26 and 27, 28, in the lower switching stage, are coupled to receive the differential control signal pairs AB, AB-bar and BB, BB-bar respectively, that have been shifted to the aforementioned lower level range.

The output signal generating section 3 is formed of FETs 33, 34, diodes 36, 36, and the FETs 47, 48 which constitute respective current sources. The drain, gate and source electrodes of the FET 34 are respectively connected to the power source potential Vdd, the drain electrode of FET 24, and the anode of the diode 36. The cathode of the diode 36 is connected to the current source FET 48. A source follower circuit is thereby formed which amplifies the current drive capacity of the signal appearing at point P, to produce a corresponding output signal OUT. Similarly, the FET 33, diode 36 and current source FET 47 function as a source follower circuit whereby the output signal OUT-bar is produced, varying in potential in correspondence with the signal appearing at point Q in the current switching section 2, but having an increased current drive capacity.

The circuit of FIG. 1 functions as a two-input AND gate, for the following reasons. If the input signals A, B both are at the H level, then the FETs 21, 23, 25 and 27 of the current switching section 2 will each be set in the on state, so that a current which is determined by the current source FET 46 flows through the load resistor 31 via a path through the FETs 21, 27, while in addition a current which is determined by the current source FET 45 flows through that load resistor 31 via a path through the FETs 23, 25. Hence the potential at point Q becomes lowered from the Vdd potential (by an amount equal to the product of the value of the load resistor 32 and the sum of the respective current levels determined by the current source FETs 45, 46), so that the output signal OUT-bar goes to the L level. In that condition, since no current flows through the load resistor 32, the output signal OUT is at the H level.

If both of the input signals A, B attain the L level, then the FETs 22, 24, 26 and 28 will each be set in the on condition. In that condition, a current that is determined by the current source FET 45 flows through the load resistor 32 via a path through the FETs 22, 26, while in addition a current that is set by the current source FET 46 flows through the load resistor 32 via a path through the FETs 24, 28. Hence, the potential at the connection point P will fall, by the same amount as described above for point Q, so that the output signal OUT will go to the L level, while since no current flows in the load resistor 31, the output signal OUT-bar will be at the H level.

If the input signal A is at the H level while the input signal B is at the L level, then each of the FETs 21, 24, 25 and 28 will be in the on condition, so that a current determined by the current source FET 45 flows through the load resistor 32 via a path through the FETs 24, 25 while in addition a current determined by the current source FET 46 flows through the load resistor 32 via a path through the FETs 24, 28. Thus in this case too, the signals OUT, OUT-bar go to the L and H levels respectively.

If the input signal A is at the L level while the input signal B is at the H level, then each of the FETs 22, 23, 26 and 27 will be in the on condition, so that a current determined by the current source FET 46 flows through the load resistor 32 via a path through the FETs 22, 26, while in addition a current determined by the FET 45 flows through the load resistor 32 via a path through the FETs 22, 27.

Hence, in each of the preceding three cases, current flow occurs through the load resistor 32 and not through the load resistor 31, so that the potential at point P will be low, and the output signal OUT will be at the L level, whereas the output signal OUT-bar will change to the H level.

Figure 2A:
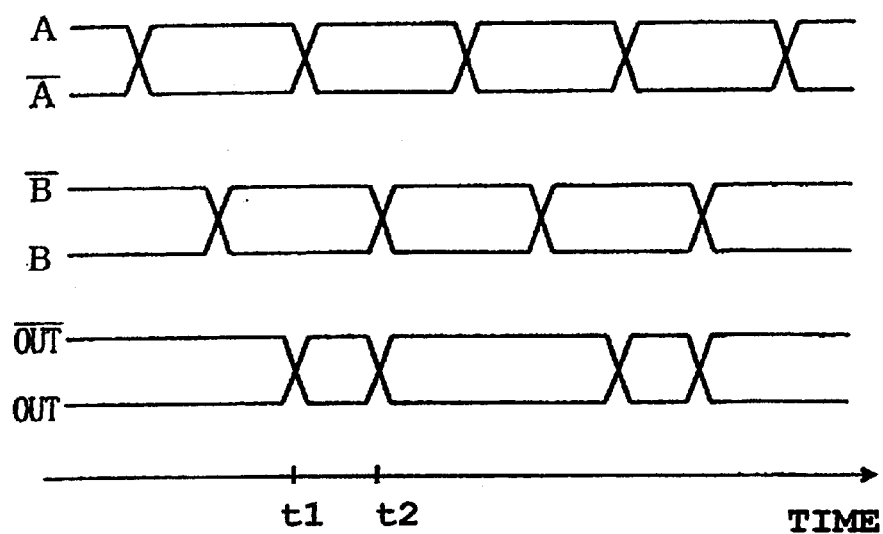
FIGS. 2A and 2B are waveform diagrams for use in describing the operation of the circuit of FIG. 1.
Figure 2B:
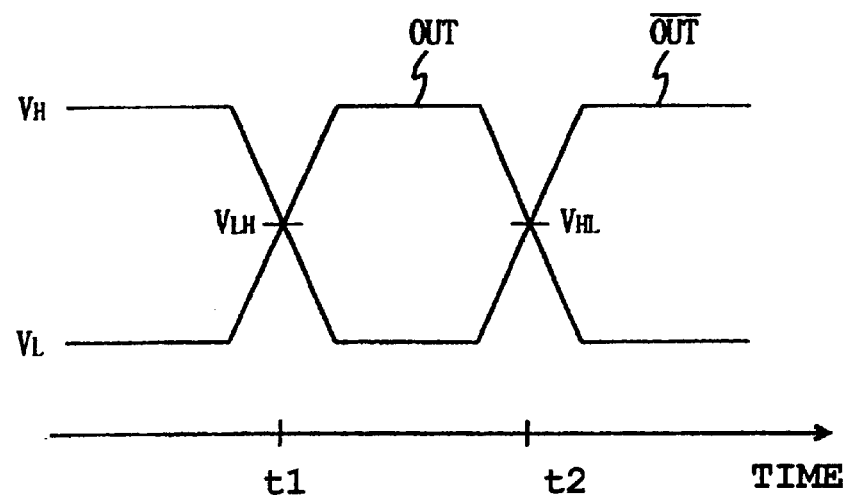

FIG. 2A shows signal waveforms of the two-input AND gate of FIG. 1, assuming that the input differential signal pair A, A-bar undergo logic level transitions between their H and L logic level potentials at identical time points, as also do the input signal pair B, B-bar. FIG. 2B is an expanded view of part of FIG. 2A, for illustrating the manner in which the output signals OUT, OUT-bar vary in accordance with changes in the input signals A, B. Specifically, FIG. 2B illustrates the case in which the input signals A, B change from the condition (L, H) to the condition (H, H) at time point t1 and back to the condition (L, H) at time point t2.

With the current switching section 2 of the AND gate of FIG. 1, the four differential transistor pairs formed of FETs 21 to 28 are disposed symmetrically with respect to the current paths described above, As a result, the respective values of drain-source voltage developed across the FETs in a current path will be the same for each of the current paths, so that the respective potentials of the points S1, S2 shown in FIG. 1 do not vary, and hence, the FETs 45 and 46 can function as respective current sources that each pass an identical value of current, irrespective of the current paths that are enabled within the current switching section. In addition, the current switching section is configured such that each of the various current paths passes through one FET in each of the switching stages, and such that irrespective of whether current is switched to flow through the load resistor 31 or load resistor 32, that current will flow via the same number of paths (i.e., two paths).

For these reasons, when the differential control signals which control differential transistor pairs change in opposite directions at the same time point, the rise-times and fall-times of resultant current flow transitions through the load resistors 31 and 32 will be identical. Hence, this will also be true for the output signal pair OUT, OUT-bar, i.e., the output signal OUT will always change between the H and L logic levels at the same speed as the inverse signal OUT-bar. Thus as shown in FIG. 2B, the point at which the output signal pair OUT, OUT-bar attain the same potential (i.e., VLH, VHL), during a logic level transition, will always be midway within a change of the signal OUT between the high (VH) and low (VL) levels and also midway within the corresponding change of the signal OUT-bar between the high and low levels.

Although the case has been described above of a two-input AND gate, the first embodiment of a transistor logic circuit is applicable to various types of two-input logic functions. This will be described referring to FIGS. 3A, 3B, 3C, in which a transistor logic circuit having a control signal generating section shown in FIG. 3A and current switching and output signal generating sections shown in FIG. 3B can be configured to perform any of the various logic operations, simply by selecting an appropriate combination of connections of control signals to the differential transistor pairs of the current switching section. The table of FIG. 3C shows the relationships between various combinations of control signal connections and resultant logic operations, for the case of the AND, NAND, OR and NOR operations.

When the control signals are connected as shown in the second row of the table of FIG. 3C, then the circuit of FIG. 1 is configured, to perform the two-input AND function as described hereinabove. However in addition, if the signals OUT, OUT-bar are also utilized as their respective inverses (for example with the logic "1" output being expressed as the H state of the signal OUT-bar and L state of signal OUT) then such a circuit configuration will at the same time perform the NAND operation.

When the control signals are connected as shown in the fourth row of the table of FIG. 3C, then this transistor logic circuit embodiment will perform the NOR function. However in addition, if the signals OUT, OUT-bar are also utilized as their respective inverses, then such a circuit configuration will at the same time perform the OR operation.

Alternatively, by inverting the appropriate one of the pair of differential control signals applied to a differential transistor pair in the current switching section, then depending upon the selected differential transistor pair, it becomes possible to perform other logic functions, such as the AND of the input signals A-bar and B, the AND of signals A and B-bar, the OR of the signals A-bar and B or the OR of the signals A and B-bar. Thus with the transistor logic circuit shown in FIG. 3, of the ten types of logic operation that can be performed on two logic inputs, a total of eight of these possible logic operations can be performed, by appropriately setting the connections of the differential control signals produced from the control signal generating section to the respective differential transistor pairs in the current switching section.

It should be noted that the connection relationships shown in FIG. 3C are given only by way of example, and that other connection arrangements could be envisaged, for providing the same logic operations.

Figure 8:
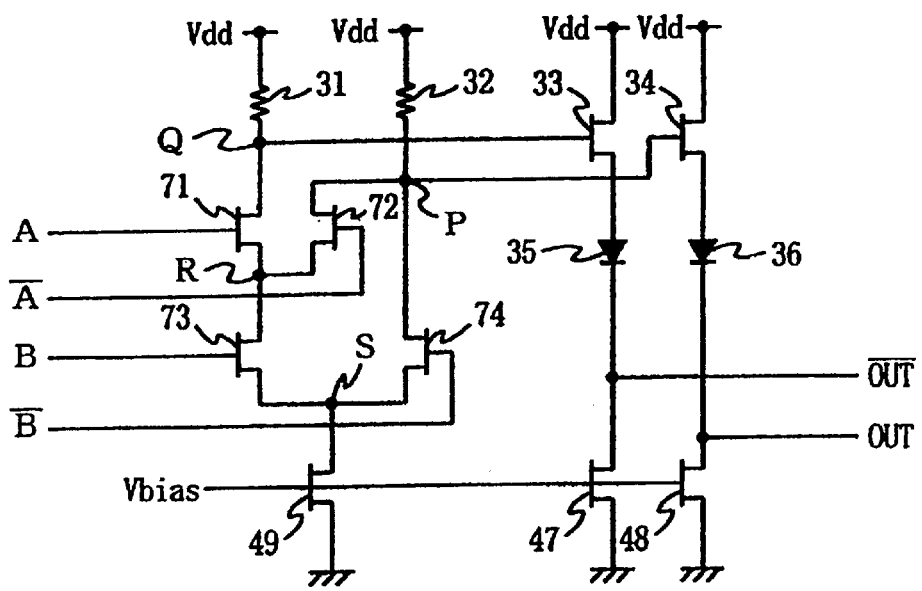
FIG. 8 is a circuit diagram of an example of a prior art type of current-switching transistor logic circuit constituting a two-input AND gate.

It can thus be understood that with the first embodiment of a transistor logic circuit, the FETs 21 to 28 are disposed symmetrically with respect to the current paths that are established in the current switching section. As a result, as described above, each of the output differential signals OUT, OUT-bar have rise-time and fall-time characteristics that are identical, so that the problems which arise with a prior art type of transistor logic circuit such as that of FIG. 8 can be overcome.

Second Embodiment

Figures 4A, 4B:
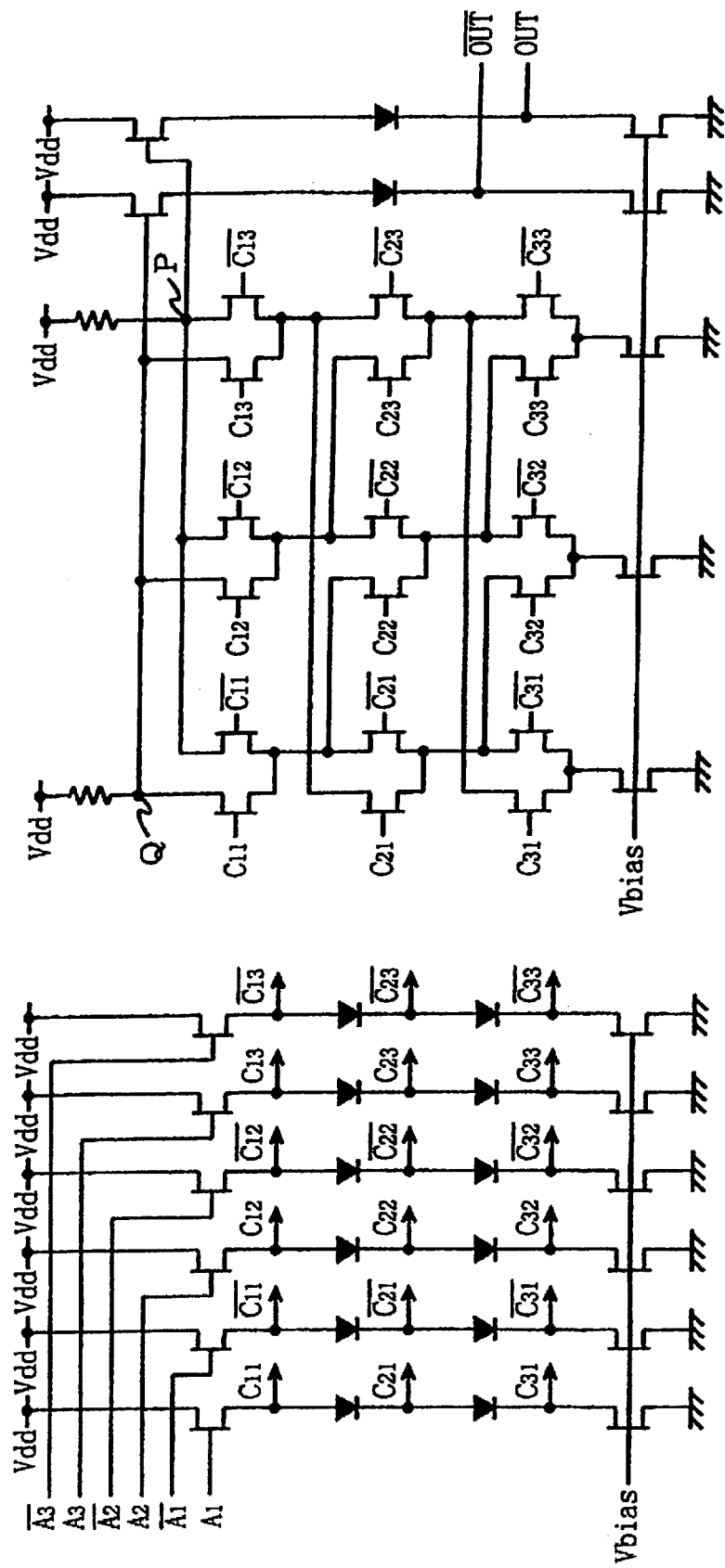
FIGS. 4A and 4B are circuit diagrams of a second embodiment of a logic circuit, configured as a 3-input AND gate.

FIGS. 4A and 4B show a second embodiment of a transistor logic circuit according to the present invention, which is configured as a 3-input AND gate. In the same way as for the preceding embodiment, this is formed of a control signal generating section shown in FIG. 4A and a current switching section and output signal generating section, shown together in FIG. 4B. The output signal generating section is identical to that of the first embodiment, so that detailed description will be omitted. The 3-input AND gate of this embodiment and the 2-input AND gate of the FIG. 1 are particular examples of an n-input AND gate, i.e., where the value of n is made equal to 2, or 3.

The control signal generating section includes a plurality of diodes, used to apply level-shifting to the input signals A1, A1-bar, A2, A2-bar, A3, A3-bar. More generally, such a control signal generating section operates on a set of input differential signal pairs $A_j$, $A_j$-bar, (where $1 \leq j \leq n$) to generate differential control signal pairs $C_{i,j}$, $C_{i,j}$-bar, (where $1 \leq i \leq n$), i.e., a total of $n^2$ differential control signal pairs, having n different level ranges. Specifically, each of the differential control signal pairs $C_{1,l}$, $C_{1,l}$-bar to $C_{1,n}$, $C_{1,n}$-bar is set to the first (i.e., highest) level range, each of the pairs $C_{2,l}$, $C_{2,l}$-bar to $C_{2,n}$, $C_{2,n}$-bar is set to the second level range, . . . , each of the control signal pairs $C_{n,l}$, $C_{n,l}$-bar to $C_{n,n}$, $C_{n,n}$-bar is set to the n-th (i.e., lowest) level range.

The differential control signal pairs $C_{i,j}$, $C_{i,j}$-bar are supplied to the current switching section. This is formed of a total of $2n^2$ FETs for current switching, two load resistors 31, 32, and n FETs which function as respective current sources. The $2n^2$ FETs are connected as $n^2$ differential transistor pairs. The gate electrodes of these $n^2$ differential transistor pairs receive respective ones of the $n^2$ differential control signal pairs produced from the control signal generating section. A FET that is controlled by a control signal $C_{i,j}$ will be designated as $S_{i,j}$, while a FET that is controlled by a control signal $C_{i,j}$-bar will be designated as $T_{i,j}$. The $n^2$ differential transistor pairs are arranged in n stages, each containing n differential transistor pairs, with current paths leading from the load resistors 31, 32 to the n current source FETs passing successively through these stages.

When such a transistor logic circuit is configured as an n-input AND gate as in the example of FIGS. 3A and 3B, the $n^2$ differential transistor pairs are respectively connected as follows. The drain electrode of each FET $S_{i,j}$ is connected via one of the two load resistors to the power source potential Vdd, while the drain electrode of each FET $T_{i,j}$ is connected via the other one of the two load resistors to the power source potential Vdd. The source electrodes of FETs $S_{i,j}$ and $T_{i,j}$ are connected together. The source electrodes of each differential transistor pair $S_{i,j}$, $T_{i,j}$ are:

(a) connected to the drain electrodes of the pair of FETs $T_{i+1,j}$, $S_{i+1,j+1}$, if i<n−1 and j<n−1, and (b) connected to the drain electrodes of the FETs $T_{i+1,j}$, $S_{i+1,l}$ if i<n−1 and j=n.

The source electrodes of respective differential transistor pairs of the n-th switching stage are connected to the FETs constituting the current sources.

The n-input AND operation performed by such a transistor logic circuit is similar to 2-input AND operation described hereinabove for the first embodiment, so that detailed description will be omitted.

With this embodiment, as for the first embodiment, the $2n^2$ FETs which perform current switching are disposed symmetrically with respect to the current paths which pass into the current sources, so that the drain-source bias voltages applied to the various differential transistor pairs of the current switching section will be substantially identical. Thus, when the differential control signals applied to a differential transistor pair change in opposite directions at the same time point, the rise time of current flow through one of the load resistors 31, 32 will be identical to the fall time of the current flow through the other one of these resistors. As a result, as described for the first embodiment, the pair of output differential signals from the AND gate will have rise-time and fall-time characteristics that match one another.

With this embodiment as for the preceding AND gate embodiment, if the output signal pair OUT, OUT-bar are used as their respective logic inverses, then the circuit of FIG. 4 performs the NAND operation.

Furthermore with this embodiment, as for the preceding AND gate embodiment, various other logic operations can be achieved, by altering the pattern of interconnections from that shown in FIGS. 4A and 4B. In particular, if each of the differential control signal pairs are applied to the corresponding differential transistor pair in the inverse relationship to that shown in FIGS. 4A and 4B, then an n-input NOR or n-input OR function can be realized.

In addition, as described for the preceding embodiment, various other special logic operations can be achieved by inverting the respective control signal pairs that are applied to particular ones of the differential transistor pairs in the current switching section, to perform AND, OR, NAND or NOR operations between specific ones of the logic inputs. As a further alternative, various AND or OR operations could be performed by inverting the connections of one or more of the input signal pairs A1, A1-bar etc., from the condition shown in FIG. 4A.

Moreover, other logic functions can be realized, by altering the connections between differential transistor pairs. For example if the source electrodes of the differential transistor pairs $S_{i,j}$, $T_{i,j}$ for which the condition i<n−1 is satisfied are connected to the drain electrodes of the FETs $S_{i+1,j}$, $T_{i+1,j+1}$, (to the drain electrodes of the FETs $S_{i+1,j}$, $T_{i+1,l}$ when j=n), then the OR function can be realized.

Figure 9A:
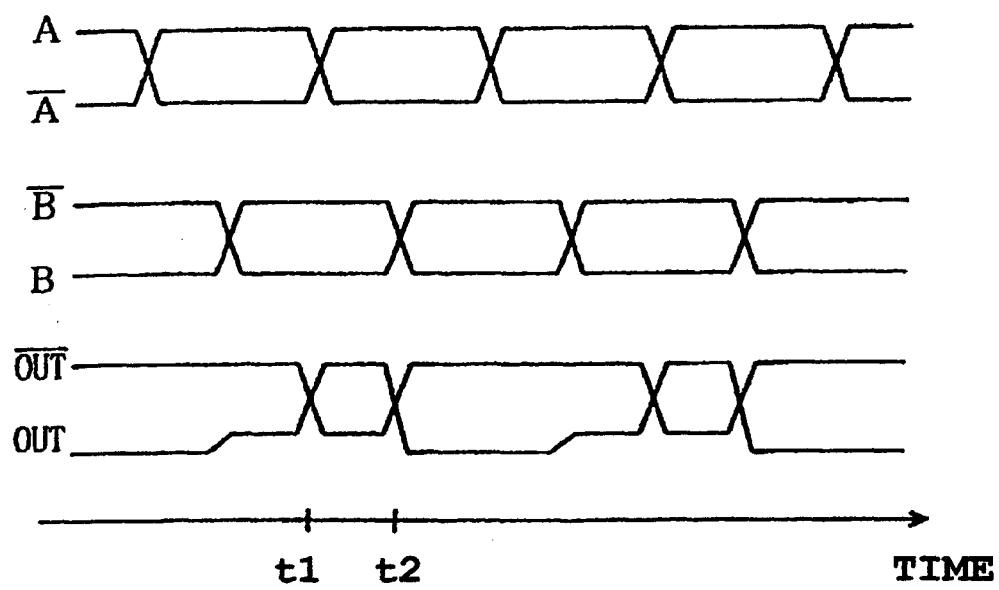
FIGS. 9A and 9B are waveform diagrams of signals in the circuit of FIG. 8.
Figure 9B:
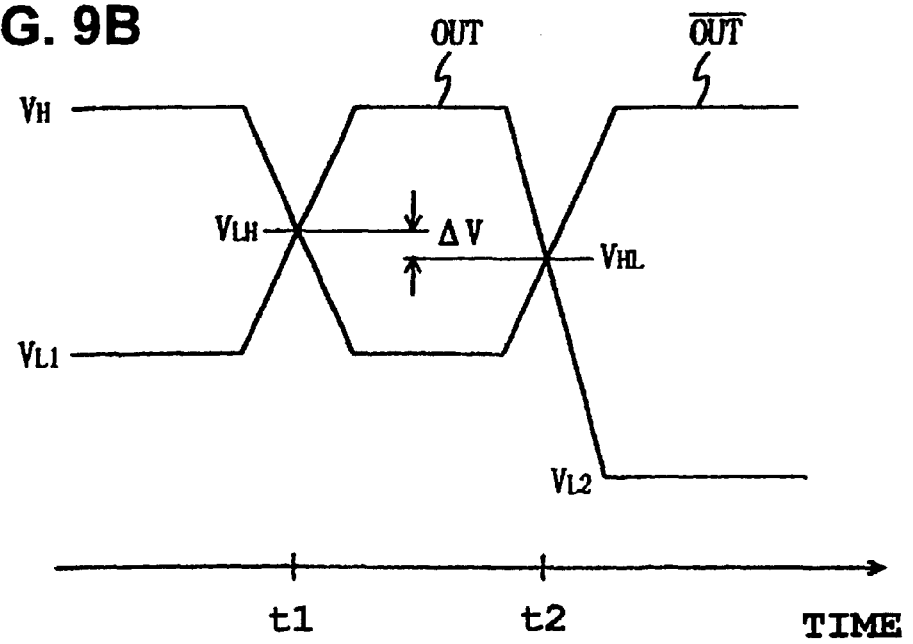

Irrespective of which of such various possible modifications of the circuit of FIGS. 4A and 4B are performed, the symmetrical arrangement of the current-switching FETs in the current switching section with respect to the current paths will be maintained, with each current path passing through one FET in each switching stage, so that each of the output signals OUT, OUT-bar from the circuit will have matching rise-time and fall-time characteristics, and hence the problem of the prior art illustrated in FIGS. 9A and 9B will not occur.

Third Embodiment

A third embodiment will be described referring to FIGS. 5A, 5B and 5C. This is a 2-input transistor logic circuit which performs the EXOR and EXNOR operations. FIG. 5A shows the control signal generating circuit, FIG. 5B shows the current switching section and output signal generating section, and FIG. 5C is a table showing relationships between combinations of connections of control signals and the resultant logic operations.

The control signal generating section and the output signal generating section are respectively identical those of the first embodiment described above, so that detailed description will be omitted. The current switching section is formed of FETs 51 to 62, load resistors 31, 32, and current sources constituted by respective FETs 45, 46. With this embodiment, the current switching section contains six differential transistor pairs, as opposed to the four differential transistor pairs of the two-input AND gate of the first embodiment. Those elements of this embodiment which have corresponding elements in the first embodiment shown in FIG. 1 are designated by corresponding reference numerals, and detailed description of these will be omitted.

The current switching section performs switching of current paths in response to the four differential control signal pairs (AT, AT-bar), (AB, AB-bar), (BT, BT-bar) and (BB, BB-bar) which are supplied from the control signal generating section. As shown in FIG. 5B, the six differential transistor pairs are arranged in two switching stages, with current flows occurring successively through these stages, from the load resistors 31, 32 into the current source FETs 45, 46, and with the differential transistor pairs (51, 52), (53, 54), (55, 56), (57, 58) constituting the upper stage and the pairs (59, 60), (61, 62) constituting the lower stage. The drain electrodes of the FETs 51, 53, 55, 57 are each connected via the load resistor 31 to the power source potential Vdd, while the drain electrodes of 52, 54, 56, 58 are each connected via the load resistor 32 to the power source potential Vdd. The source electrodes of the differential transistor pair 51, 52 are connected to the drain electrode of FET 59, the source electrodes of the differential transistor pair 53, 54 are connected to the drain electrode of FET 61, the source electrodes of the differential transistor pair 55, 56 are connected to the drain electrode of FET 60, the source electrodes of the differential transistor pair 57, 58 are connected to the drain electrode of FET 62, the source electrodes of the differential transistor pair 59, 60 are connected to the current source FET 45 and the source electrodes of the differential transistor pair 61, 62 are connected to the current source FET 46.

The four pairs of differential control signals from the current switching section are supplied to respective ones of the six differential transistor pairs of the current switching section as indicated in the table of FIG. 5C, in accordance with the logic operation to be performed. The four first-stage differential transistor pairs (51, 52), (53, 54), (55, 56), (57, 58) receive control signals of the first level range (i.e., signals AT, AT-bar, BT, or BT-bar), while the two remaining differential transistor pairs (59, 60) and (61, 62) receive respective control signals which have been level-shifted to the second level range.

With the control signals connected as shown in the first row of the table of FIG. 5C, the transistor logic circuit performs the exclusive-OR (EXOR) operation on the input signals A, B. If the signals OUT, OUT-bar are also utilized as their respective inverses, then the circuit can at the same time perform the exclusive-NOR (EXNOR) operation on the input signals A, B.

This embodiment performs the above logic operations as follows. If either of the input signals A, B is at the H level, then the FETs 51, 53, 56, 58, 60 and 62 will be set in the on condition, and current will flow from load resistor 32 via the FETs 56, 60 and via the FETs 58, 62. If either of the input signals A, B is at the L logic level, then FETs 52, 54, 55, 57. 59. 61 will each be set in the on state, so that current will flow from load resistor 32 via the FETs 52, 59 and also via the FETs 54, 61. In each of these two cases, current flows through the load resistor 32, so that the potential at point P in FIG. 5B will be low, and hence the output signal OUT will be at the L level. Conversely, since no current flows through the load resistor 31 in such a case, the output signal OUT-bar will be at the H level.

If the input signals A, B are at the H and L levels respectively, then each of the FETs 51, 54, 56, 57, 59 and 62 will be set in the on condition, so that current will flow from the load resistor 31 via a path through the FETs 51, 59 and also via a path through the FETs 57, 62. On the other hand if the input signal A is at the L level and input signal B is at the H level, then the FETs 52, 53, 55, 58, 60, 61 will each be in the on state, so that current will flow from load resistor 31 via a path through the FETs 55, 60 and also via a path through the FETs 53, 61. In each of these two cases, since current flows through the load resistor 31, the potential at the connection point Q in FIG. 5B will become low (i.e., lower than the power source potential Vdd by an amount equal to the product of the value of a load resistor and the sum of the currents which flow through two parallel paths) and hence the output signal OUT-bar will be at the L level. Conversely, since no current flows through the load resistor 32 in such a case, the output signal OUT will be at the H level. In that way, the exclusive-OR operation is performed.

Similarly, if the control signal pairs are connected to the differential transistor pairs of the current switching section as shown in the second row of the table of FIG. 5C, then the output signal pair OUT, OUT-bar express the result of applying the exclusive-NOR operation on the two logic inputs expressed by the input signals A, B.

With this embodiment, as for the first embodiment, all of the FETs of the current switching section are disposed symmetrically with respect to the current paths which are formed through the current switching section. Each current path that is formed in the current switching section extends through a load resistor, two successive FETs (in the upper and lower switching stages respectively) and a current source FET. Hence, for the same reasons as described for the first embodiment, each of the output signals OUT, OUT-bar will have matching rise-time and fall-time characteristics.

Fourth Embodiment

FIG. 6 is a block diagram of a fourth embodiment of a logic circuit configuration. This operates as a compound AND-OR gate consisting of three AND gates and one OR gate, and has three control signal generating sections 1-1, 1-2 and 1-3, three current switching sections 2-1, 2-2, 2-3, three inter-stage output signal generating sections 4-1, 4-2, 4-3, and an output signal generating circuit 3, and operates on seven pairs of input differential signals, (A1, A1-bar), (A2, A2-bar), (A3, A3-bar), (A4, A4-bar), (A5, A5-bar), (A6, A6-bar) and (A7, A7-bar). The logic operation performed can be expressed as:

$$A1 \& A2 + A3 \& A4 + A5 \& A6 \& A7$$

Where the & symbol indicates the AND operation and the + symbol indicates the OR operation. For simplicity of description, each of the input differential signal pairs is indicated as a single signal in FIG. 6, for example with the differential signal pair A1, A1-bar being indicated only as A1. The control signal generating section 1-1 and the current switching section 2-1 respectively have the same circuit configurations as the corresponding sections of the two-input AND gate shown in FIG. 1 and described above. The current switching section 2-1 produces an output differential signal pair D1, D1-bar as the logic product of the two input signals A1, A2. The control signal generating section 1-2 and current switching section 2-2 respectively have the same configurations as the corresponding sections of the two-input AND gate of FIG. 1, and derive an output differential signal pair D2, D2-bar as the logic product of the two input signals A3, A4. The control signal generating section 1-3 and current switching section 2-3 respectively have the same configurations as the corresponding sections of the three-input AND gate of FIG. 4, and derive an output differential signal pair D3, D3-bar as the logic product of the three input signals A5, A6 and A7. The output signal generating section 3 has the same configuration as for that of the first embodiment shown in FIG. 1.

The inter-stage output signal generating sections 4-1, 4-2, 4-3 respectively receive the differential signal pairs (D1, D1-bar), (D2, D2-bar), (D3, D3-bar) produced from the current switching sections 2-1, 2-2, 2-3. Each of these inter-stage output signal generating sections applies level-shifting to the input differential signal supplied thereto, to produce a corresponding set of three differential signal pairs, with these pairs having respectively different level ranges. In general, with such a compound logic circuit, with a total of n differential signal pairs being supplied from n current switching sections to respective inter-stage output signal generating sections, each of these inter-stage output signal generating sections will produce a set of n differential signal pairs having respectively different level ranges. In this example, n is equal to 3.

Figure 7:
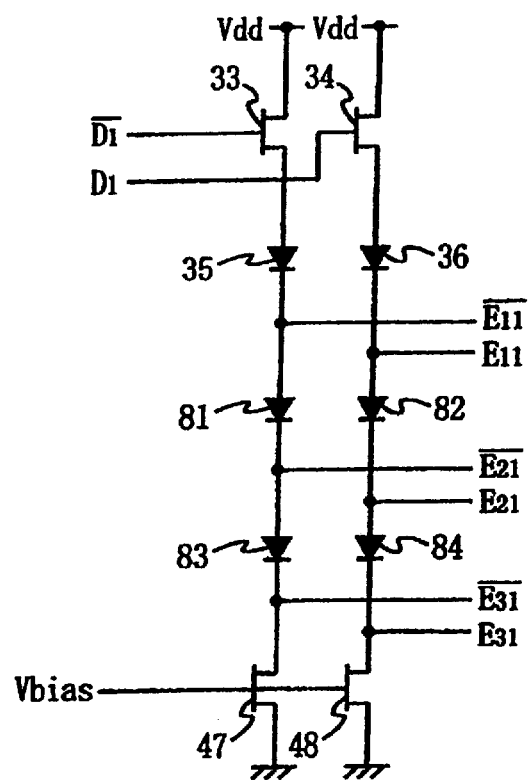
FIG. 7 is a circuit diagram showing details of an output signal generating section in the fourth embodiment.

FIG. 7 shows the circuit configuration of the inter-stage output signal generating section 4-1 of FIG. 6. As can be understood, the operation is similar to that of the output signal generating section 3 of the circuit of FIG. 1, with the addition of four diodes 81 to 84. In FIG. 7, the FET 34, diode 36 and the current source FET 48 constitute a source follower circuit, whereby the current drive capacity of the signal D1 is amplified, to be output as a corresponding signal E11. The diodes 82 and 84 are connected in series with the diode 36 and the current source FET 48, with the cathode electrodes of the diodes 82, 84 respectively producing the output signals E21, E31. Hence, the output signal E21 corresponds to the output signal E11, but level-shifted to a transition range that differs from the transition range of signal E11 by an amount equal to the voltage drop across the diode 82. Similarly, the output signal E31 corresponds to the signal E11, level-shifted by an amount equal to the sum of the voltage drops across the diodes 82, 84 respectively. The output signal E21-bar corresponds to the output signal E11-bar, level-shifted from the transition range of signal E11-bar by an amount equal to the voltage drop across the diode 81, and the output signal E31-bar corresponds to the signal E11-bar, level-shifted by an amount equal to the sum of the voltage drops across the diodes 81, 83 respectively.

The inter-stage output signal generating section 4-1 thereby derives three differential signal pairs, $D_i$, $D_i$-bar (i=1 to 3), having respectively different level ranges, from the differential signal pair D1, D1-bar produced by the current switching section 2-1. Each of the other inter-stage output signal generating sections 4-2 and 4-3 is configured and operates as described for the section 4-1, with the inter-stage output signal generating section 4-2 producing three differential signal pairs (E12, E12-bar), (E22, E22-bar), (E32, E32-bar) having respectively different level ranges, corresponding to the differential signal pair D2, D2-bar produced from the current switching section 2-2, and the inter-stage output signal generating section 4-3 producing the three differential signal pairs (E13, E13-bar), (E23, E23-bar), (E33, E33-bar) having respectively different level ranges, corresponding to the differential signal pair D3, D3-bar produced from the current switching section 2-3.

The resultant set of differential signal pairs, which can be expressed as $E_{i,j}$, $E_{i,j}$-bar (where i=1 to 3, j=1 to 3), are supplied to the current switching section 2-4. This section derives a differential signal pair F, F-bar as the logic sum of the signals D1, D2, D3, by operating on the set of differential signal pairs $E_{i,j}$, $E_{i,j}$-bar. The configuration of the current switching section 2-4 is based on the 3-input AND gate shown in FIG. 4B, but converted to a 3-input OR gate by appropriately altering the connections of the differential control signals to the current-switching FET pairs as described hereinabove.

The output signal generating section 3 produces an output differential signal pair OUT, OUT-bar corresponding to the signal pair F, F-bar, expressing the result of applying the aforementioned logic function

A1 & A2+A3 & A4+A5 & A6 & A7 to the logic inputs which are applied to this compound logic gate.

The compound logic gate is formed of logic gates which are configured as described for the first to third embodiments, and hence each of the output signals OUT, OUT-bar produced from this embodiment have matching rise-time and fall-time characteristics.

Another feature of such a type of compound logic gate circuit is that the number of control signals having various different level ranges is substantially smaller, for the initial logic stage, than for the second and any subsequent logic stages. With the logic gate of FIG. 6 for example, there is an initial logic stage of three AND operations, to be performed by the set of control signal generating sections 1-1 to 1-3 and current switching sections 2-1 to 2-3, requiring a total of 17 differential control signal pairs (C11,C11-bar) . . . (C37, C37-bar) to be produced by the control signal generating sections. However in the case of the second logic stage (i.e., a 3-input OR operation) it is only necessary to produce a total of nine differential control signal pairs (E11, E11-bar) . . . , (E33, E33-bar) using three different level ranges, to be supplied to the current switching section 2-4. Hence, the circuit scale of such a compound logic gate circuit becomes successively smaller for successive logic stages.

With the present invention. the level range and amplitude of the differential signal pair produced from a current switching sections depend upon the resistance value of the load resistors, the number of current paths through which currents flow concurrently via a load resistor, and the level of current that is set by each of the current source FETs of the current switching section (i.e., the level of current that is passed by a current source FET when a current path via that FET is enabled). As described for the prior art example, that set current value will be altered if there is a change in drain-source bias voltage of a current source FET. Thus for example, if other parameters are unchanged, the current value that is determined by a current source FET in the current switching section 2 of FIG. 1 would be higher than for the current switching section of FIG. 4B, since there will be a higher value of drain-source voltage developed across each FET in each current path in the case of the circuit of FIG. 1.

Specifically, referring to the waveform example of FIG. 2B, even if all of the circuit parameters are made identical for each of the various current switching sections of the embodiment of FIG. 6, the difference between VH and VL (i.e., the amount of voltage drop across a load resistor) will vary in accordance with the respective numbers of logic inputs (and hence, number of switching stages) of these sections.

It would be possible to compensate for this by utilizing output signal generating sections having suitable respectively different characteristics. However the need for this can be avoided by forming each of the current switching sections as follows. Each current switching section is configured such as to set the voltage Vd as a fixed value which is identical for each of the current switching sections, where Vd is the product of the resistance value of each load resistor and the sum of the currents that are passed concurrently by the current source FETs of a current switching section. For example, with the first embodiment, that voltage Vd would be obtained by multiplying the resistance value of each of the (identical) load resistors 31, 32 by the sum of the two currents that are passed by the current source FETs 45 and 46 when any of the various possible pairs of current paths through the current switching section are concurrently established.

In that case, the levels of the differential signals produced from each of the current switching sections will become independent of the respective numbers of logic inputs to these sections. Hence, all of the output signal generating sections can be configured with identical circuit parameters, as can all of the control signal generating sections, thereby facilitating the manufacture of such a compound logic gate circuit.

The present invention is of course not limited to a compound logic gate circuit as shown in FIG. 6, i.e., such a circuit could be configured with three or more logic stages, and could operate on an arbitrary number of sets of input signals, to perform various combinations of arbitrary logic functions.

As can be understood from the above description of embodiments it is an essential feature of the present invention that within a current switching section of a logic gate circuit, for any current path that is established passing through either of two load resistors, the respective drain-source bias voltages that are developed within each current path and the number of these drain-source voltages will be substantially identical, while in addition the transistor pairs constituting the current switching section are interconnected in a symmetrical manner with respect to the current paths such that the number of current paths through which current flows via a load resistor will be the same for both of the load resistors (for example, two paths, in the case of the current switching section 2 of FIG. 1). As a result, a differential signal pair that are generated across these load resistors will have matching rise-time and fall-time characteristics, enabling similar matching rise-time and fall-time characteristics to be obtained from an output signal produced from such a logic gate circuit. Such a logic gate circuit is therefore suitable for high-speed logic operations, and enables devices capable of such high-speed operation to be manufactured by using low-cost processing technology, thereby enabling circuit costs to be decreased.

What is claimed is:

1. A logic circuit for performing a logic operation on n logic inputs expressed by n respective input differential signal pairs, where n is a plural integer, the logic circuit comprising:

a control signal generating circuit section for converting said n pairs of input differential signals to n sets of differential control signal pairs, each of said sets formed of n differential control signal pairs which correspond in common to a specific input differential signal pair and having respective ones of n different level ranges, a current switching section including a pair of resistive elements each having a first terminal thereof connected to a first potential of a DC power source, and a plurality of current sources connected to a second potential of said DC power source for controlling current flow levels though respective current paths, and a multi-stage connection network connected to said current sources and connected at a pair of connection points to respective second terminals of said resistive elements for performing switching of said current paths to thereby generate a differential signal pair at said connection points, said network formed of a plurality of transistor pairs each having respective first terminals thereof connected together and respective second terminals thereof connected to one of said differential control signal pairs, and an output signal generating circuit section coupled to said connection points, for generating an output differential signal pair corresponding to said differential signal pair generated by said current switching section;

wherein said transistor pairs are interconnected as n switching stages each comprising a plurality of said transistor pairs, said switching stages being connected in series between said connection points and said second potential of the power source, said switching stages being interconnected such that each of said current paths extends from one of said connection points through one transistor in each of said switching stages, wherein all transistor pairs of each said switching stage are controlled by respective differential control signal pairs each having a level range that is specific to said switching stage, wherein in each said transistor pair of an $n^{th}$ one of said switching stages respective common connections of said first terminals of said transistor pairs are coupled via corresponding ones of said current sources to said second potential, and wherein a third terminal of a first transistor of each of said transistor pairs of a first one of said switching stages is connected to a first one of said connection points and a third terminal of a second transistor of said each transistor pair of the first switching stage is connected to a second one of said connection points.

2. The logic circuit according to claim 1, wherein each of said transistor pairs of said multi-stage connection network comprises two bipolar transistors, and wherein said first terminal, second terminal and third terminal of a transistor are respectively an emitter electrode, a base electrode and a collector electrode of said transistor.

3. The logic circuit according to claim 1, wherein each of said n switching stages comprises n of said transistor pairs and wherein, designating i and j as a pair of integers which each take values within the range 1 through n, designating as $X_{i,j}$ a transistor pair in said current switching section that are controlled by a differential control signal pair which are assigned the i-th one of said level ranges and correspond to the j-th one of said n input differential signal pairs, designating the transistor of said pair $X_{i,j}$ that is set in the conducting state when a non-inverted one of said j-th input signal pair is at a high level as $S_{i,j}$ and designating the transistor of said pair $X_{i,j}$ that is set in the conducting state when an inverted one of said j-th input differential signal pair is at a high level as $T_{i,j}$, said mutually connected first terminals of said transistors of said transistor pair $X_{i,j}$ are connected to a third terminal of one transistor of the transistor pair $X_{i+1,j}$ and to a third terminal of one transistor of the transistor pair $X_{i+1,j+1}$, when j is other than n, and are connected to a third terminal of one transistor of the transistor pair $X_{i+1,j}$ and to a third terminal of one transistor of the transistor pair $X_{i+1,l}$ when j is equal to n.

4. The logic circuit according to claim 3 wherein in said multi-stage connection network, said mutually connected first terminals of said transistors $S_{i,j}$, $T_{i,j}$ of said transistor pair $X_{i,j}$ are connected to respective third terminals of the transistors $T_{i+1,j}$ and $S_{i+1,j+1}$, when j is other than n, and are connected to respective third terminals of the transistors $T_{i+1,j}$, $S_{i+1,l}$ when j is equal to n.

5. The logic circuit according to claim 3 wherein in said multi-stage connection network, said mutually connected first terminals of said transistors $S_{i,j}$, $T_{i,j}$ of said transistor pair $X_{i,j}$ are connected to respective third terminals of the transistors $S_{i+1,j}$ and $T_{i+1,j+1}$ when j is other than n, and are connected to respective third terminals of the transistors $S_{i+1,j}$, $T_{i+1,l}$ when j is equal to n.

6. The logic circuit according to claim 3, wherein the value of n is equal to 2.

7. The logic circuit according to claim 6, wherein in said multi-stage connection network mutually connected first terminals of transistors $S_{1,1}$, $T_{1,1}$ of the transistor pair $X_{1,1}$ are connected to respective third terminals of the transistors $T_{2,1}$ and $S_{2,2}$, and mutually connected first terminals of transistors $S_{1,2}$, $T_{1,2}$ of the transistor pair $X_{1,2}$ are connected to respective third terminals of the transistors $T_{2,2}$ and $S_{2,1}$.

8. The logic circuit according to claim 6, wherein in said multi-stage connection network mutually connected first terminals of transistors $S_{1,1}$, $T_{1,1}$ of the transistor pair $X_{1,1}$ are connected to respective third terminals of the transistors $S_{2,1}$ and $T_{2,2}$, and mutually connected first terminals of transistors $S_{1,2}$, $T_{1,2}$ of the transistor pair $X_{1,2}$ are connected to respective third terminals of the transistors $T_{2,2}$ and $S_{2,1}$.

9. The logic circuit according to claim 1, wherein said logic operation is determined as one of a set of logic operations which correspond to respective ones of a set of combinations of connections of said differential control signals to said transistor pairs of said current switching section, and wherein said set of logic operations includes at least the AND, OR, NAND and NOR operations.

10. The logic circuit according to claim 1, wherein each of said transistor pairs of said multi-stage connection network comprises two field effect transistors, and wherein said first terminal, second terminal and third terminal of a transistor are respectively a source electrode, a gate electrode and a drain electrode of said transistor.

11. The logic circuit according to claim 1 where said number n of logic inputs is equal to 2, said control signal generating circuit section converting first and second input pairs of differential signals, respectively expressing first and second logic inputs, to corresponding first and second control signal pairs having a first level range and to corresponding third and fourth control signal pairs having a second level range, wherein said current switching section comprising first and second ones of said switching stages, connected in series between said second terminals of said pair of resistive elements and said second potential of the power supply, wherein said first switching stage comprises four of said transistor pairs and said second switching stage comprises two of said transistor pairs and wherein within said current switching section, first and second transistor pairs, in said first switching stage, are controlled in common by a differential control signal pair having said first level range and corresponding to said first input differential signal pair, third and fourth transistor pairs, in said first switching stage, are controlled in common by a differential control signal pair having said first level range and corresponding to said second input differential signal pair, a fifth transistor pair, in said second switching stage, are controlled by a differential control signal pair having said second level range, corresponding to said first input differential signal pair, and a sixth transistor pair, in said second switching stage, are controlled by a differential control signal pair having said second level range, corresponding to said second input differential signal pair.

12. The logic circuit according to claim 11, wherein a third terminal of a first transistor of each of said transistor pairs in said first switching stage is connected to one of said pair of connection points and the third terminal of a second transistor of each of said transistor pairs in the first switching stage is connected to the other one of said pair of connection points.

13. The logic circuit according to claim 12, wherein in said current switching section the mutually connected first terminals of said first transistor pair are connected to a third terminal of a first transistor of said sixth transistor pair, the mutually connected first terminals of said second transistor pair are connected to a third terminal of a second transistor of said sixth transistor pair, the mutually connected first terminals of said third transistor pair are connected to a third terminal of a first transistor of said fifth transistor pair, and the mutually connected first terminals of said fourth transistor pair are connected to a third terminal of a second transistor of said fifth transistor pair.

14. The logic circuit according to claim 11, wherein said logic operation is determined as one of a set of logic operations which correspond to respective ones of a set of combinations of connections of said differential control signals to said transistor pairs of said current switching section, and wherein said set of logic operations includes at least the exclusive-OR operation and exclusive-NOR operations.

15. The logic circuit according to claim 11, wherein each of said transistor pairs of said multi-stage connection network comprises two field effect transistors, and wherein said first terminal, second terminal and third terminal of a transistor are respectively a source electrode, a gate electrode and a drain electrode of said transistor.

16. The logic circuit according to claim 11, wherein each of said transistor pairs of said multi-stage connection network comprises two bipolar transistors, and wherein said first terminal, second terminal and third terminal of a transistor are respectively an emitter electrode, a base electrode and a collector electrode of said transistor.

17. A logic circuit for receiving a plurality of input differential signal pairs expressing respective logic inputs and for sequentially performing a plurality of logic operations on said logic inputs in successive logic stages, the logic circuit comprising a plurality of current switching sections corresponding to respective ones of said logic stages, with each of said current switching sections performing predetermined logic processing on a plurality of differential control signal pairs having a plurality of level ranges, a control signal generating section for converting each pair of said plurality of input differential signal pairs to a plurality of corresponding differential signal pairs having a plurality of level ranges, and supplying said corresponding differential signal pairs to a current switching section of a first logic stage, as respective differential control signal pairs, a plurality of inter-stage output signal generating sections each adapted to convert a differential signal pair produced by a preceding one of said current switching sections to produce a corresponding plurality of differential control signal pairs having respectively different level ranges and supplying said differential control signal pairs to a succeeding one of said current switching sections, and an output signal generating circuit for converting a differential signal pair produced by a current switching section of a final logic stage to an output differential signal pair;

wherein, designating a total number of logic inputs to a current switching section as n where n is a plural integer, each of said current switching sections comprises a pair of resistive elements having respective first terminals thereof connected to a first potential of a DC power source, and a multi-stage connection network connected between said resistive elements and a second potential of said power source, said network being coupled at a pair of connection points to respective second terminals of said resistive elements and being formed of a plurality of transistor pairs with respective first terminals of each of the transistors of each said pair connected together, said transistor pairs being interconnected as n switching stages with each switching stage formed of a plurality of said transistor pairs, and said transistor pairs being controlled by respective ones of said differential control signal pairs to perform switching of paths of current flow between said connection points and a second potential of said power source for thereby generating a differential signal pair at said pair of connection points;

and wherein in each of said switching stages, said transistor pairs of said switching stage are controlled by differential control signal pairs which have a level range that is specific to said switching stage.

18. The logic circuit according to claim 17, wherein said control signal generating section and each of said inter-stage output signal generating sections produces said differential signal pairs at a total number of level ranges that is equal to a total number of logic inputs to a succeeding current switching section.

19. The logic circuit according to claim 18 wherein in each of said current switching sections said pair of resistive elements have substantially identical resistance values, each of said current switching sections comprises n current source elements which are connected between said second potential of the power source and the mutually connected first electrodes of respective ones of transistor pairs of an n-th one of said switching stages for thereby determining respective values of current in said current paths, and wherein the product of said resistance value and a total value of currents that flow concurrently in respective ones of said current paths of a current switching section is made substantially identical for each of said current switching sections.

20. The logic circuit according to claim 17, wherein each of said transistor pairs of each said multi-stage connection network comprises two field effect transistors, and wherein said first terminal, second terminal and third terminal of a transistor are respectively a source electrode, a gate electrode and a drain electrode of said transistor.

21. The logic circuit according to claim 17, wherein each of said transistor pairs of each said multi-stage connection network comprises two bipolar transistors, and wherein said first terminal, second terminal and third terminal of a transistor are respectively an emitter electrode, a base electrode and a collector electrode of said transistor.

22. A logic circuit for performing a logic operation on n logic inputs expressed by n respective input differential signal pairs, where n is a plural integer, the logic circuit comprising a control signal generating circuit section for converting said n pairs of input differential signals to n sets of differential control signal pairs, each of said sets formed of n differential control signal pairs which correspond in common to a specific input differential signal pair and have respective ones of n different level ranges, a current switching section including a pair of resistive elements each having a first terminal thereof connected to a first potential of a DC power source, current source means connected to a second potential of said power source, and a multi-stage connection network connected at a pair of connection points to respective second terminals of said resistive elements and coupled between said resistive elements and said current source elements for performing switching of current paths between said connection points and said current source means to thereby generate a differential signal pair at said connection points, said network formed of a plurality of transistor pairs each having respective first terminals thereof connected together and respective second terminals thereof connected to one of said differential control signal pairs, and an output signal generating circuit section coupled to said connection points, for generating an output differential signal pair corresponding to said differential signal pair generated by said current switching section;

wherein said transistor pairs are interconnected as n switching stages which are connected in series between said connection points and said second potential of the power source, each of said switching stages formed of n of said transistor pairs, said switching stages being interconnected such that each of said current paths extends from one of said connection points through one transistor in each of said switching stages, and all of said transistor pairs of each switching stage being controlled by differential control signal pairs having a level range that is predetermined as specific to said switching stage, wherein a third terminal of a first transistor of each of said transistor pairs of a first one of said n switching stages is connected to a first one of said connection points and a third terminal of a second transistor of said each transistor pair of the first switching stage is connected to a second one of said connection points, wherein said current source means comprises n current source elements, and wherein each of respective mutually connected pairs of first electrodes of said transistor pairs of an n-th one of said switching stages is connected to a predetermined corresponding one of said current source elements.

23. The logic circuit according to claim 22, wherein each of said transistor pairs of each said multi-stage connection network comprises two field effect transistors, and wherein said first terminal, second terminal and third terminal of a transistor are respectively a source electrode, a gate electrode and a drain electrode of said transistor.

24. The logic circuit according to claim 22, wherein each of said transistor pairs of each said multi-stage connection network comprises two bipolar transistors, and wherein said first terminal, second terminal and third terminal of a transistor are respectively an emitter electrode, a base electrode and a collector electrode of said transistor.

25. The logic circuit according to claim 22, wherein said logic operation is determined as one of a set of logic operations which correspond to respective ones of a set of combinations of connections of said differential control signals to said transistor pairs of said current switching section, and wherein said set of logic operations includes at least the AND, OR, NAND and NOR operations.

26. A logic circuit for performing a logic operation on two logic inputs respectively expressed by first and second input differential signal pairs, comprising a control signal generating circuit section for converting said first and second input differential signal pairs to respectively corresponding first and second differential control signal pairs having a first level range and to respectively corresponding third and fourth differential control signal pairs having a second level range, a current switching section including a pair of resistive elements each having a first terminal thereof connected to a first potential of a DC power source, current source means connected to a second potential of said power source, and a multi-stage connection network connected at a pair of connection points to respective second terminals of said resistive elements and coupled between said resistive elements and said current source means for performing switching of current paths between said connection points and said current source means to thereby generate a differential signal pair at said connection points, said multi-stage connection network formed of a plurality of transistor pairs each having respective first terminals thereof connected together and respective second terminals thereof connected to one of said differential control signal pairs, and an output signal generating circuit section coupled to said connection points, for generating an output differential signal pair corresponding to said differential signal pair generated by said current switching section;

wherein said transistor pairs of said current switching section are interconnected as first and second switching stages which are connected in series between said resistive elements and said current source means, said first switching stage comprises four of said transistor pairs and said second switching stage comprises two of said transistor pairs, wherein a third terminal of a first transistor of each of said transistor pairs of said first switching stage is connected to a first one of said connection points and a third terminal of a second transistor of each transistor pair of the first switching stage is connected to a second one of said connection points, wherein said current source means comprises two current source elements, wherein each of respective mutually connected pairs of first electrodes of said transistor pairs of said second switching stages is connected to a predetermined corresponding one of said current source elements, and wherein, first and second transistor pairs, in said first switching stage, are controlled in common by said first differential control signal pair having said first level range and corresponding to said first input differential signal pair, third and fourth transistor pairs, in said first switching stage, are controlled in common by said second differential control signal pair having said first level range and corresponding to said second input differential signal pair, a fifth transistor pair, in said second switching stage, are controlled by said third differential control signal pair having said second level range and corresponding to said first input differential signal pair, and a sixth transistor pair, in said second switching stage, are controlled by said fourth differential control signal pair having said second level range and corresponding to said second input differential signal pair.

27. The logic circuit according to claim 26, wherein each of said transistor pairs of each said multi-stage connection network comprises two field effect transistors, and wherein said first terminal, second terminal and third terminal of a transistor are respectively a source electrode, a gate electrode and a drain electrode of said transistor.

28. The logic circuit according to claim 26, wherein each of said transistor pairs of each said multi-stage connection network comprises two bipolar transistors, and wherein said first terminal, second terminal and third terminal of a transistor are respectively an emitter electrode, a base electrode and a collector electrode of said transistor.

29. The logic circuit according to claim 26, wherein said logic operation is determined as one of a set of logic operations which correspond to respective ones of a set of combinations of connections of said differential control signals to said transistor pairs of said current switching section, and wherein said set of logic operations includes at least the exclusive-OR and exclusive-NOR operations.

30. A logic circuit for performing a logic operation on n logic inputs expressed by n respective input differential signal pairs, where n is a plural integer, the logic circuit comprising a control signal generating circuit section for converting said n pairs of input differential signals to n sets of differential control signal pairs, each of said sets formed of n differential control signal pairs which correspond in common to a specific input differential signal pair and have respective ones of n different level ranges, a current switching section including a pair of resistive elements each having a first terminal thereof connected to a first potential of a DC power source and current source means connected to a second potential of said power source, and a multi-stage connection network connected at a pair of connection points to respective second terminals of said resistive elements for performing switching of current paths between said connection points and said second potential of said power source via said current source means to thereby generate a differential signal pair at said connection points, said network formed of a plurality of transistor pairs each having respective first terminals thereof connected together and respective second terminals thereof connected to one of said differential control signal pairs, and an output signal generating circuit section coupled to said connection points, for generating an output differential signal pair corresponding to said differential signal pair generated by said current switching section; wherein said transistor pairs are interconnected as n switching stages which are connected in series between said connection points and said current source means, with each of said switching stages comprising a set of transistor pairs which are controlled by differential control signal pairs having an identical one of said level ranges, an n-th one of said switching stages comprises n of said transistor pairs, a third terminal of a first transistor of each of said transistor pairs of a first one of said switching stages is connected to a first one of said connection points and a third terminal of a second transistor of each transistor pair of the first switching stage is connected to a second one of said connection points, said current source means comprises n current source elements connected between said second potential of the current source and the mutually connected first electrodes of respective ones of said n transistor pairs of said n-th switching stages, each of the mutually connected first electrodes of respective ones of said transistor pairs of each of the first through (n−1)-th switching stages is connected to a third electrode of a transistor at least one predetermined corresponding transistor pair in a succeeding one of said switching stages, said transistor pairs are interconnected such as to be controlled by said differential control signal pairs in response to a least a first combination of said n logic inputs for enabling current flow through a first set of n current paths between a first one of said connection points and said current source elements and in response to at least a second combination of said n logic inputs for enabling current flow through a second set of n current paths between said second one of the connection points and said current source elements, and wherein each of said current paths passes through one transistor of each of said switching layers.

31. The logic circuit according to claim 30, wherein each of said transistor pairs of each said multi-stage connection network comprises two field effect transistors, and wherein said first terminal, second terminal and third terminal of a transistor are respectively a source electrode, a gate electrode and a drain electrode of said transistor.

32. The logic circuit according to claim 30, wherein said current source elements comprise respective field effect transistors having a common bias voltage applied to the gate electrodes thereof.

33. The logic circuit according to claim 30, wherein each of said transistor pairs of each said multi-stage connection network comprises two bipolar transistors, and wherein said first terminal, second terminal and third terminal of a transistor are respectively an emitter electrode, a base electrode and a collector electrode of said transistor.

* * * * *